(12) United States Patent
Nemouchi et al.

(10) Patent No.: US 8,586,463 B2
(45) Date of Patent: Nov. 19, 2013

(54) METHOD FOR PREPARING A LAYER COMPRISING NICKEL MONOSILICIDE NISI ON A SUBSTRATE COMPRISING SILICON

(75) Inventors: Fabrice Nemouchi, Moirans (FR); Veronique Carron, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 933 days.

(21) Appl. No.: 12/613,088

(22) Filed: Nov. 5, 2009

(65) Prior Publication Data

US 2010/0117238 A1    May 13, 2010

(30) Foreign Application Priority Data

Nov. 7, 2008   (FR) ...................................... 08 57581

(51) Int. Cl.
*H01L 21/3205*   (2006.01)
(52) U.S. Cl.
USPC .......................................... 438/588; 257/250
(58) Field of Classification Search
USPC ........... 257/259, 377, 250, 754; 438/588, 589
See application file for complete search history.

(56) References Cited

U.S. PATENT DOCUMENTS

| | | | | |
|---|---|---|---|---|
| 7,382,028 B2 * | 6/2008 | Hsieh et al. | ................... | 257/385 |
| 7,482,668 B2 * | 1/2009 | Hsieh et al. | ................... | 257/486 |
| 8,247,861 B2 * | 8/2012 | Tempel et al. | ................ | 257/316 |
| 2001/0022398 A1 * | 9/2001 | Grill et al. | ..................... | 257/758 |
| 2001/0045605 A1 * | 11/2001 | Miyashita et al. | ............ | 257/382 |
| 2005/0202663 A1 | 9/2005 | Tsuchiaki | | |
| 2005/0250319 A1 | 11/2005 | Carruthers et al. | | |
| 2007/0004205 A1 | 1/2007 | Detavernier et al. | | |
| 2007/0176214 A1 * | 8/2007 | Kwon et al. | ................... | 257/250 |

OTHER PUBLICATIONS

C. Detavernier, et al. "Influence of Alloying Elements on the Formation and Stability of NiSi", ECS Transactions, 3, (2), 2006, pp. 131-138.
D. Deduytsche, et al., "Formation and Morphological Stability of NiSi in the Presence of W, Ti, and Ta Alloying Elements", Journal of Applied Physics, 101, 2007, pp. 044508-1-044508-8.
D. Mangelinck, et al. "Enhancement of Thermal Stability of NiSi Films on (100)Si and (111)Si by Pt Addition", Applied Physics Letters, vol. 75, No. 12, Sep. 20, 1999, pp. 1736-1738.

* cited by examiner

*Primary Examiner* — Nathan Ha
(74) *Attorney, Agent, or Firm* — Oblon, Spivak, McClelland, Maier & Neustadt, L.L.P.

(57) ABSTRACT

A method for fabricating a layer including nickel monosilicide NiSi on a substrate including silicon. The method includes the steps of incorporating, on a portion of the thickness of the substrate comprising silicon, an element selected from W, Ti, Ta, Mo, Cr and mixtures thereof; depositing, on the substrate, a layer of nickel and a layer of an element selected from Pt, Pd, Rh, and mixtures thereof or a layer comprising both nickel and an element selected from Pt, Pd, Rh, and mixtures thereof; heating to a temperature sufficient for obtaining the formation of a layer comprising nickel silicide optionally in the form of nickel monosilicide NiSi; incorporating fluorine in the layer; and optionally, heating to a sufficient temperature to convert the layer to a layer comprising nickel silicide entirely in the form of nickel monosilicide NiSi.

20 Claims, 4 Drawing Sheets

METHOD FOR PREPARING A LAYER COMPRISING NICKEL MONOSILICIDE NISI ON A SUBSTRATE COMPRISING SILICON

TECHNICAL FIELD

The present invention relates to a method for preparing a layer comprising nickel monosilicide NiSi on a substrate comprising silicon belonging, for example, to a semiconductor structure, this layer comprising nickel monosilicide NiSi having phase stability at high temperature (for example, at temperatures of about 700° C.), morphological film stability and, moreover, having low resistivity.

This method has an application in particular in the production of electronic semiconductor devices, such as MOS transistors comprising portions of silicon, and for which a silicide layer is required in particular to decrease the contact resistance between the various silicon portions, such as the source and the drain of a MOS transistor, and to provide the connection between its portions and the interconnection levels.

Even more particularly, this method may have an application in the production of semiconductor electronic devices, comprising a lower transistor level comprising a layer comprising nickel monosilicide obtained by the inventive method and a higher transistor level, such as germanium based transistors.

PRIOR ART

As previously mentioned, it may be important to incorporate, in silicon based semiconductor devices, a layer of silicide for limiting the contact resistance between the various portions of the silicon device, such as the source and the drain in a transistor.

The main silicides used in this type of context are titanium disilicide $TiSi_2$, cobalt disilicide $CoSi_2$ and nickel silicide NiSi, with a preference for nickel silicide NiSi, in particular for sub-65 nm technologies because of its lower formation temperature in comparison with other silicides, its low resistivity, and the low silicon consumption required to form it.

However, nickel monosilicide NiSi has the following drawbacks:

low thermal stability, in so far as, at a temperature close to 600° C. and higher temperatures, dewetting occurs between the NiSi layer and the underlying silicon zone (the NiSi layer being converted to aggregates and thereby losing its film character), and thus a serious degradation of the silicide-silicon contact;

moreover, above a temperature of about 750° C., a phase conversion occurs of the nickel monosilicide NiSi to nickel disilicide $NiSi_2$, the latter causing an increase in the resistivity of the layer and a deterioration of the contact quality between the layer and the underlying Si zones, because of the high surface roughness between the newly formed $NiSi_2$ phase and the underlying silicon zones.

Figure 3:
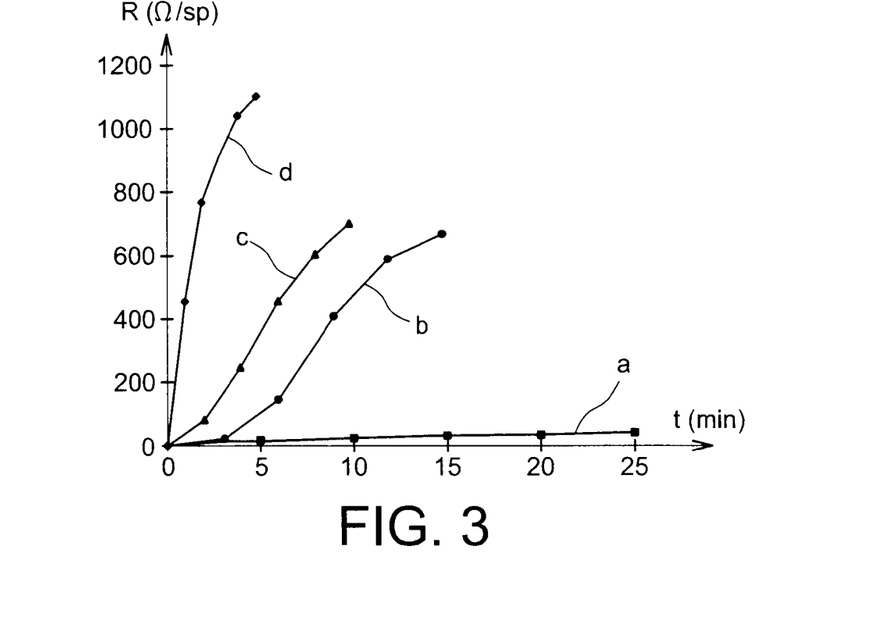
FIG. 3 is a graph showing the film resistance R of NiSi (in Ω/squared denoted Ω/sq) as a function of time t (in min) applied for various annealing temperatures (respectively 550° C. for curve a, 600° C. for curve b, 650° C. for curve c, and 700° C. for curve d).

As it appears in FIG. 3 showing a graph illustrating the film resistance R of NiSi (in Ω/squared denoted Ω/sq) as a function of time t (in min) applied for various annealing temperatures (respectively 550° C. for curve a, 600° C. for curve b, 650° C. for curve c, and 700° C. for curve d), the film resistance of NiSi increases significantly for rising annealing temperatures. Thus, the silicide NiSi remains unchanged after 25 minutes of treatment at 550° C., while in less than 2 minutes at 600° C., a significant increase in the film resistance occurs. This increase in film resistance reflects a change in morphology of the film (due to aggregation) and the film thus no longer performs its low resistivity contact role for any temperature above 600° C. It is therefore out of the question to use nickel monosilicide NiSi in an architecture that requires processing temperatures above 600° C.

In order to overcome problems of NiSi dewetting and delay the formation of various solutions have been proposed consisting of:

either adding an alloy element in the nickel (the said alloy element being soluble in NiSi); and/or by adding an element that is insoluble in the silicide NiSi.

Thus, it has been shown by Mangelinck et al., in Applied Physics Letters, 75 (1999), 1736 and by Cheng et al. in Journal of Vacuum Science Technology A 18 (2000), 1776 that the addition of a soluble element such as Pt, Pd and Rh, in particular platinum Pt, served to prevent the formation of $NiSi_2$, in particular below 850° C. for Pt. Platinum Pt serves in particular to delay the formation of $NiSi_2$ by promoting the reaction between NiSi and the underlying silicon and thereby increasing the nucleation temperature of $NiSi_2$. Apart from its role in delaying the nucleation of $NiSi_2$, platinum also acts on the delay of the aggregation of NiSi. The addition of Pt to NiSi thereby increases the mesh parameters and modifies the texture of the silicide in order to make the layer less vulnerable to dewetting.

It has also been demonstrated by Detavernier et al., Electrochemical Society Transactions 3 (2006) 13 and Deduytsche et al., Journal of Applied Physics 101 (2007) that elements such as W, Ti, Ta, Mo, Cr serve to delay the aggregation of NiSi (or in other words, the dewetting of the NiSi film) towards higher temperatures than in the absence of these elements, these incorporated elements being distributed at the NiSi grain boundaries during its formation.

However, by adding the abovementioned elements, the resistivity of the NiSi film is generally increased, which is counterproductive insofar as the purpose of this type of film is, inter alia, to decrease the series and resistances between the elements underlying this film.

Thus a genuine need subsists for a method for fabricating a layer comprising nickel monosilicide NiSi from a substrate comprising silicon which has both high temperature phase stability (that is without phase conversion of NiSi to $NiSi_2$) and a morphological film stability at high temperature (that is without film dewetting) while having a low resistivity.

SUMMARY OF THE INVENTION

The inventors have thus discovered, inadvertently, a method comprising a sequence of steps and ingredients which serve to meet the abovementioned need.

According to a first object, the invention thus relates to a method for fabricating a layer comprising nickel monosilicide NiSi on a substrate comprising silicon successively comprising the following steps:

a) a step of incorporating, on a portion of the thickness of the said substrate comprising silicon, an element selected from W, Ti, Ta, Mo, Cr and mixtures thereof;

b) a step of depositing, on the said substrate obtained in step a), a layer of nickel and a layer of an element selected from Pt, Pd, Rh and mixtures thereof or a layer comprising both nickel and an element selected from Pt, Pd, Rh and mixtures thereof;

c) a step of heating to a temperature sufficient for obtaining the formation of a layer comprising nickel silicide optionally in the form of nickel monosilicide NiSi;

d) a step of incorporating fluorine in the said layer obtained in c); and e) optionally, a step of heating to a sufficient temperature to convert the layer mentioned in d) to a layer comprising nickel silicide entirely in the form of nickel monosilicide NiSi.

Thus, this sequence of steps resolves the problems related to:
- the conversion of the layer comprising NiSi to aggregates when the layer is exposed to high temperatures (for example about 700° C.) thanks in particular to the presence, in the layer, of an element selected from W, Ti, Ta, No and Cr);
- the conversion of NiSi to $NiSi_2$ when the layer is exposed to high temperatures (for example about 700° C.) thanks in particular to the presence, in the layer, of an element shifting the $NiSi_2$ nucleation temperature towards higher temperatures than those existing in the absence of such an element, this element being selected from Pt, Pd and Rh and mixtures thereof;
- the increase in resistance of the layer due to the incorporation of the two types of abovementioned elements, thanks to the addition of an element (in particular fluorine) serving to compensate for such an increase in resistance.

It is important for the sequence of steps of the abovementioned method to be properly observed so that the effects of each of the abovementioned elements are obtained.

It could not be inferred outright that the introduction into NiSi of the abovementioned species could confer the advantages mentioned above. In fact, the behaviour of several species, in minority quantities, in a system, remains difficult to predict, because the introduction of species into a system modifies the thermodynamic equilibrium thereof. By way of example, this mechanism is very clearly illustrated by the experiment of Darken, in which the same quantity of carbon is initially present in the two phases of a Fe(C)/FeSi(C) pair. While the system appears to be at equilibrium, the carbon is redistributed in a non-uniform manner between the two phases due to the presence of silicon.

Thus the first step of the method consists in incorporating, on a portion of the thickness of a substrate comprising silicon, an element selected from W, Ti, Ta, Mo, Cr and mixtures thereof.

Substrate comprising silicon means a substrate comprising zones of silicon, not excluding the fact that this substrate may contain zones which are not of silicon, such as insulating zones, for example of silicon dioxide.

The substrate comprising silicon may correspond, for example, when the method is carried out for the production of a MOS transistor, to the channel, the source and/or the drain of the said transistor, which are all of silicon.

The step of incorporating the abovementioned element a) can be carried out conventionally by ion implantation.

In practical terms, in the case of ion implantation, the substrate comprising silicon is subjected to a beam of ions of an element selected from W, Ti, Ta, Mo, Cr and mixtures thereof so that the elements penetrate into the thickness of the substrate comprising silicon. By this technique, it is possible to adjust the quantity of elements to be incorporated in the thickness of the substrates comprising silicon, by adjusting the ion flux and the penetration depth of the said ions in the thickness of the said substrate by adjusting the accelerating voltage.

The implantation energy is adjusted according to the element to be implanted and the thickness of the silicon to be treated. For example, the dose is set between $5 \times 10^{13}$ at/$cm^2$ and $1 \times 10^{15}$ at/$cm^2$ for a thickness of 20 nm to be implanted.

Typically, the thickness of the substrate comprising silicon on which the abovementioned element is to be incorporated is that corresponding to the thickness of the layer comprising nickel monosilicide NiSi which is to be obtained, this thickness conventionally being between 10 nm and 40 nm.

The element content is conventionally selected so as to prevent any dewetting of the silicide formed with regard to the silicon, this content however not being too high to avoid degrading the resistivity of the nickel monosilicide NiSi which will form and its contact resistance with the underlying silicon.

The element incorporated in the first step a) is advantageously present in a content of between 0.05 and 1 atomic % of the total number of silicon atoms of the substrate.

Advantageously, the element incorporated in the first step is the element tungsten.

Once the step a) is completed, the inventive method may comprise, before the implementation of the deposition step b), a step of cleaning the surface of the substrate. The purpose of the cleaning is to remove the silicon dioxide $SiO_2$ which, if possible, covers the silicon surface, the presence of this oxide being liable to block the silicidation. It may concern either a native oxide or an oxide deposited before the ion implantation steps.

After the optional cleaning step or when the cleaning is unnecessary, after the incorporation step a), the inventive method comprises a step of deposition, on the said substrate obtained in a), of a layer of nickel and a layer of an element selected from Pt, Pd, Rh and mixtures thereof or a layer comprising both nickel and an element selected from Pt, Pd, Rh and mixtures thereof.

The element nickel is the element that is intended to enter into the constitution of the nickel silicide NiSi.

The element selected from Pt, Pd, Rh and mixtures thereof is intended to stabilize the NiSi phase when it is formed, in particular on the one hand to prevent the formation of $NiSi_2$ when the layer comprising NiSi is subjected to high temperatures (such as a temperature of 700° C.), the drawback of $NiSi_2$ being both to have a high resistivity and to require a high silicon consumption (more than one and a half times that of NiSi) and on the other hand, the aggregation of NiSi.

Whether the deposition is carried out using two distinct layers or using a single layer comprising the two elements, the element Ni will advantageously account for at least 90 atomic % (that is at least 90% of the total atoms comprising Ni, the deposited elements Pd, Pt, Rh or mixtures thereof), whereas the element selected from Pd, Pt, Rh or mixtures thereof will advantageously account for no more than 10 atomic % of the total number of atoms (that is no more than 10% of the total atoms comprising Ni, the deposited elements Pd, Pt, Rh or mixtures thereof).

The deposition of the two layers or of a single layer when the latter comprises the two elements can be carried out by any type of metal layer deposition technique.

For example, mention can be made of the following:
- chemical vapour deposition (CVD);
- cathode sputtering;
- electron beam evaporation;
- atomic layer deposition (ALD);
- electroless deposition (that is without electric current input).

More precisely, by way of example, for depositing a single layer, this deposition can be carried out by sputtering an alloy target comprising nickel and the other element (that is Pd, Pt, Rh or mixtures thereof) or by simultaneous co-sputtering of two distinct targets: a nickel target and a target of the other element (that is Pd, Pt, Rh or mixtures thereof).

By way of example, for depositing two layers, this deposition can be carried out by depositing a layer of nickel followed by the deposition of a layer of the other element (that is Pd, Pt, Rh or mixtures thereof).

The deposition step is advantageously carried out at a temperature below 100° C., in particular to prevent the premature formation of silicide during the deposition.

The thickness of the layer or layers may be between 1 nm and 100 nm, preferably between 5 and 20 nm.

The inventive method then comprises a step of heating to a sufficient temperature for the nickel to react with the silicon to form a nickel silicide whereof at least a portion may be nickel monosilicide.

Without being bound by theory, during this step, the element selected from W, Ti, Ta, Mo, Cr and mixtures thereof, insoluble in the silicide being formed, is expelled to the grain boundaries of the silicide, thereby ensuring better behaviour of the silicide by mechanical effect. On completion of this first thermal processing, the silicide formed may be a mixture of NiSi and other silicides richer in nickel.

The heating step can be carried out by a thermal process called rapid (also known as "Rapid Thermal Processing" (RTP)).

As a particular type of Rapid Thermal Processing, mention can be made of lamp-based Rapid Thermal Annealing (RTA), whereof the treatment time is generally between a few tens of seconds to a few minutes, an annealing of the spike RTA or flash RTA type. These ultra-rapid annealings correspond to processing times ranging from a few seconds, in the case of spike annealing to a few milliseconds in the case of flash annealing.

Advantageously, the heating step is carried out under an atmosphere comprising an inert gas, such as argon Ar or nitrogen $N_2$.

This heating step can be carried out at a temperature of between 200 and 600° C., for example during a period ranging from a few fractions of seconds (in particular when the heating is carried out by spike annealing) to 10 minutes for metal layer thicknesses of 1 nm to 100 nm. The thickness of the metal layers normally varies between 5 nm and 15 nm, the temperature between 300 and 450° C. and the duration between 30 seconds and 2 minutes.

On completion of this heating step, the layer thus obtained comprises nickel silicide optionally in the form of nickel monosilicide NiSi and further comprising an element selected from W, Ti, Ta, Mo, Cr and mixtures thereof and an element selected from Pt, Pd, Rh and mixtures thereof.

On the substrate upon which the metal layers are deposited and when this substrate comprises zones other than silicon zones, such as dielectric zones of metal oxide, it is possible, when the heating step is completed, that unreacted metal may subsist on the said zones other than the silicon zones.

In this case, the inventive method may comprise a step of removal of the said metal from the said zones, this removal step possibly consisting in contacting the substrate with a solution capable of selectively removing the metal with regard to the silicide formed.

For example, when the substrate comprises silicon zones on which a layer of nickel silicide has been formed and silica zones covered with an unreacted metal layer (Pd+Ni), the removal step may consist in contacting the substrate with a solution for selectively etching the metal from the silicide. In the case of nickel, an $H_2SO_4/H_2O_2/H_2O$ mixture is generally used.

Once the silicide is formed during the abovementioned heating step, the inventive method comprises a step of incorporating fluorine in the layer comprising nickel silicide obtained in step c).

This element fluorine is important to compensate for the change in resistivity and the contact resistance generated by the addition of the metal elements, such as W and Pt.

The addition of fluorine to the silicide layer has a dual effect:
 a decrease in the resistivity of the nickel silicide NiSi formed;
 a stabilisation of the NiSi formed.

This incorporation step is conventionally carried out by ion implantation of fluorine.

Advantageously, the entire quantity of fluorine implanted must be contained in the silicide layer. Thus the implantation energy will be set so that the fluorine is confined exclusively in the silicide layer. The implantation dose may be in the range from $1\times10^{13}$ to $1\times10^{15}$ at/cm$^2$.

Upon completion of this step d), a layer is thus obtained comprising nickel silicide optionally in the form of nickel monosilicide NiSi and further comprising fluorine, an element selected from W, Ti, Ta, Mo, Cr and mixtures thereof, and an element selected from Pt, Pd, Rh and mixtures thereof.

Finally, the inventive method may comprise, when the first heating step has not been sufficient to convert the nickel silicide present in the layer entirely to nickel monosilicide NiSi, a second heating step, at a heating temperature sufficient to convert all the nickel silicide present in the layer obtained in step d) to nickel monosilicide NiSi.

Furthermore, this heating step may, serve to eliminate the defects generated by the implantation of fluorine (such as amorphization), during the preceding step and to uniformly distribute the fluorine in the silicide layer.

As for the first heating step, the heating step may be carried out by Rapid Thermal Processing (RTP).

As a particular type of Rapid Thermal Processing, mention can be made of lamp-based Rapid Thermal Annealing (RTA) or spike annealing, as described above for the first heating step. Advantageously, the heating step is carried out under an atmosphere comprising an inert gas, such as argon Ar or nitrogen $N_2$.

This heating step can be carried out at a temperature of between 350° C. and 600° C., for example during a period ranging from a few fractions of seconds (in particular when the heating is carried out by spike annealing) to 10 minutes for metal layer thicknesses of 1 nm to 100 nm. The metal layer thickness generally varies between 5 nm and 15 nm, the temperature between 300 and 450° C. and the time between 30 seconds and 2 minutes. In general, the temperature applied during this second heating step is higher than that applied during the first step.

The invention also relates to a layer comprising nickel monosilicide NiSi on a substrate comprising silicon obtained by a method as previously defined, the said layer further comprising:
 an element selected from W, Ti, Ta, Mo, Cr and mixtures thereof;
 an element selected from Pd, Pt, Rh and mixtures thereof; and
 fluorine;
 this layer possibly having a thickness of between 10 nm and 40 nm.

The element selected from W, Ti, Ta, Mo, Cr and mixtures thereof is advantageously present in a content of between 0.05 and 1 atomic % of the total number of Si atoms of the substrate.

Advantageously, the nickel of the nickel monosilicide accounts for at least 90 atomic % of the total atoms of nickel and of the elements selected from Pd, Pt, Rh and mixtures thereof.

Other characteristic elements of the layers already described in the context of the production method are also valid in this case.

As previously stated, the layers comprising nickel monosilicide NiSi obtained by the inventive method cover silicon zones and may thus have an application in electronic devices, such as electronic devices comprising semiconductor zones of silicon, such as MOS transistors.

Thus, the invention may relate to a method for fabricating an electronic device successively comprising:
- a step of preparing the constituent elements of the said device, at least one of the said constituent elements being in silicon;
- a step of depositing, on each silicon constituent element, a layer comprising nickel monosilicide, which is obtained by the implementation of the method as defined above.

The electronic device may be a MOS transistor comprising constituent elements of silicon, such as the drain, source, grid.

The invention also relates to an electronic device comprising at least one silicon constituent element, the said element being covered by a layer comprising nickel monosilicide NiSi obtainable by a method as defined above, the said layer further comprising:
- an element selected from W, Ti, Ta, Mo, Cr and mixtures thereof;
- an element selected from Pd, Pt, Rh and mixtures thereof; and
- fluorine, this device possibly being a MOS transistor, in which case the silicon constituent elements covered by a layer comprising nickel monosilicide NiSi as defined above are the source, the drain and the grid.

Figure 1:
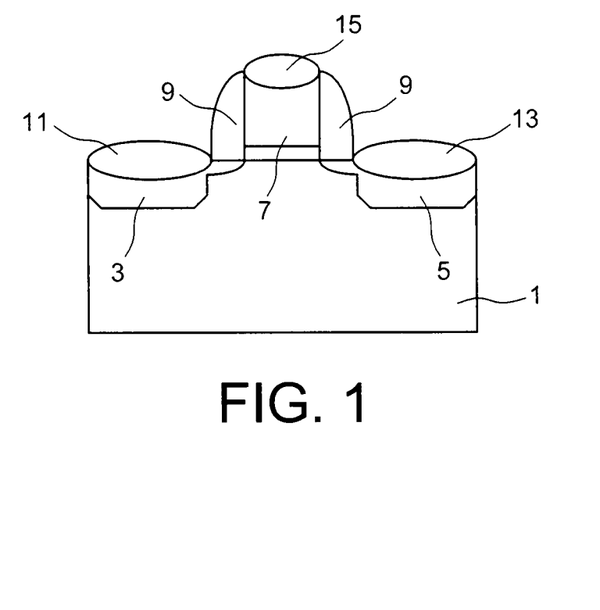
FIG. 1 shows a cross section of a MOS transistor comprising, on certain parts thereof, a layer comprising nickel monosilicide obtained by the inventive method.

An example of a transistor is shown in FIG. 1, respectively comprising:
- a silicon substrate 1;
- a source and a drain numbered respectively 3 to 5;
- a grid 7;
- spacers 9;
- layers comprising nickel monosilicide deposited respectively on the source, the drain and the grid, the said layers being numbered respectively 11, 13 and 15.

Owing to the characteristics of the layers comprising nickel monosilicide obtained by the inventive method, the inventive method can be implemented in the context of more complex devices, such as devices comprising several layers of electronic components, such as MOS transistor components.

Thus the invention also relates to a three-dimensional integrated circuit of the MOS type comprising:
- a first level comprising at least one n-MOS type transistor formed in a silicon semiconductor layer;
- layers comprising nickel monosilicide NiSi on the silicon portions of the said transistor, the said portions being the source, the drain and the grid, the said layers comprising nickel monosilicide NiSi obtainable by a method as previously defined, the said layers further comprising:
- an element selected from W, Ti, Ta, Mo, Cr and mixtures thereof;
- an element selected from Pd, Pt, Rh and mixtures thereof; and
- fluorine; and
- a second level on the said first level comprising a germanium semiconductor layer comprising at least one p-MOS type transistor.

Figure 2:
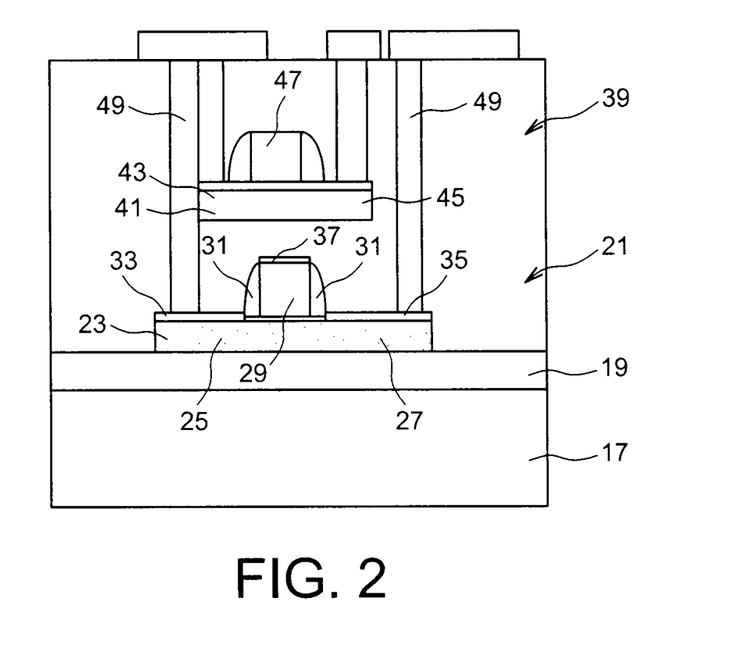
FIG. 2 shows a cross section of a device comprising a first level comprising an n-MOS transistor and comprising a second level comprising a p-MOS transistor.

An example of such a circuit is shown in FIG. 2, this circuit comprises:
- a silicon substrate 17;
- a buried oxide layer 19 deposited on a face of the said substrate;
- a lower level 21 comprising a MOS transistor respectively comprising an oriented silicon substrate (001) 23, a source and a drain respectively numbered 25 and 27, a grid 29, spacers 31 and layers comprising nickel monosilicide deposited respectively on the source, the drain and the grid, the said layers being numbered respectively 33, 35 and 37;
- an upper level 39 overlying the lower level 21, the said upper level comprising a MOS transistor respectively comprising an oriented (001) germanium substrate 41, a source, a drain and a grid respectively numbered 43, 45 and 47;
- metal interconnections 49 connecting the two levels.

The layers comprising nickel monosilicide obtained according to the inventive method are capable of withstanding, without damage, the thermal budgets required for the production of the second level (or upper level). In fact, once the first level (or lower level) is completed, the nickel monosilicide present on the silicon portions of the first level undergoes all the thermal processings of the various steps for producing the second level (such as the epitaxial germanium deposition at at least 650° C. for at least 5 minutes). With layers comprising nickel monosilicide as obtained with the methods of the prior art, this was followed by a dewetting of the layer comprising nickel monosilicide and/or the formation of $NiSi_2$, causing an increase in resistivity and contact resistance, thereby considerably degrading the performance of the transistors.

Finally, the invention also relates to a method for fabricating a three-dimensional integrated circuit of the MOS type as defined previously, that is comprising transistors having different conductivities, the said transistors being formed respectively in the first and second superimposed semiconductor layers, successively comprising:
- a step of fabricating a first level comprising at least one n-MOS type transistor formed in a silicon semiconductor layer;
- a step of depositing a layer comprising nickel monosilicide on the silicon portions of the said transistor, the said portions being the source, the drain and the grid, the said layer comprising nickel monosilicide being obtained by the implementation of the method as defined above;
- a step of transfer to the first level of a germanium semiconductor layer, thereby constituting a second level on the said first level;
- a step of fabricating in the said second level at least one p-MOS type transistor in the germanium semiconductor layer.

Apart from the step of deposition of the silicide layer, the steps of the method take place in a similar manner to those described in FR 2 896 620, incorporated here by reference.

The first level comprises n-MOS type transistors, formed in a first silicon semiconducting layer, the said layer preferably having an orientation adapted to the production of n-MOS type transistors. The first level may comprise a dielectric layer deposited on the said transistor.

The second level deposited on the first level (between which, optionally, the abovementioned dielectric layer is inserted) comprises p-MOS type transistors formed in a second semiconductor layer and, optionally, covered by a dielectric layer. The second semiconductor layer is generally of germanium having an orientation adapted to the production of p-MOS type transistors.

The transistors are conventionally produced respectively in the silicon layer for n-MOS transistors and in the germanium layer for p-MOS transistors.

This production comprises the following steps:
etching of the silicon or germanium layer to bound the transistor channel;
preparation of the source and drain placed on either side of the channel and in electrical contact therewith;
deposition of a control grid placed above the channel and separated at least therefrom by a control dielectric and a floating grid and, optionally, a tunnel dielectric;
preparation of spacers by deposition of dielectric, the said spacers flanking the faces of the tunnel dielectric/floating grid/control dielectric/control grid stack;
doping by ion implantation with n dopants (such as As, P) for n-MOS transistors and with p dopants (such as B) for p-MOS transistors.

The step of transfer of the germanium semiconductor layer can be carried out by molecular bonding and thinning or by the Smart Cute process (hydrogen implantation, bonding and detachment).

When the levels comprise several transistors, the said transistors are electrically connected by means of vias, which can be produced by dry etching. Similarly, the transistors belonging to different levels can be connected electrically by means of vertical vias, which, in addition to the fact of directly interconnecting the portions to be connected of two distinct transistors, also allow their connection to other elements of the circuit if necessary, these vias being producible by dry etching.

As mentioned above, the element fluorine contributes to lower the film resistance of the layer comprising nickel monosilicide NiSi, which is increased by the joint presence of an element selected from W, Ti, Ta, Mo, Cr and mixtures thereof and an element selected from Pd, Pt, Rh and mixtures thereof.

This is why the invention also relates to the use of the element fluorine to decrease the film resistance of a layer comprising nickel monosilicide NiSi comprising both an element selected from W, Ti, Ta, Mo, Cr and mixtures thereof and an element selected from Pd, Pt, Rh and mixtures thereof.

The invention will now be described in conjunction with the example below provided for illustration and non-limiting.

DETAILED SUMMARY OF PARTICULAR EMBODIMENTS

EXAMPLE

This example illustrates the preparation of a layer comprising NiSi according to an embodiment of the inventive method, the preparation comprising the following steps:
deposition of a layer of thermal oxide on a silicon plate, in order to limit the effects of the ionic impacts of the dose of W to a thickness of 20 nm;
incorporation of tungsten W in a silicon substrate by ion implantation at the rate of $5 \times 10^{14}$ at/cm$^2$ at an energy of 60 keV, in order to circumscribe the tungsten on a thickness substantially equal to 20 nm, which corresponds to a concentration lower than 0.5 atomic % of W in the silicon;
the removal of the protective thermal oxide layer;
a successive deposition on the silicon of a metal layer by cathode sputtering (PVD) of Ni and Pt, the platinum content being close to 8 atomic % with regard to the nickel;
a thermal processing step under controlled and inert atmosphere by RTA at a temperature close to 450° C. for 60 seconds;
an incorporation of fluorine by implantation in the silicide formed after thermal processing, so that the dose of F is $1 \times 10^{15}$ at/cm$^2$ at an energy of 7 KeV, which confines the entire dose of F in the layer comprising nickel silicide;
a step of thermal processing at various temperatures (650° C. and 700° C.), the samples thus processed being then subjected to a film resistance measurement.

The tests were conducted on a solid plate, previously implanted by As, in order to simulate the conditions encountered with an n-MOS transistor. This pre-implantation serves in particular to check whether undesirable interactions occur between the dopant (As) and the additional elements, that is Ni, Pt and F here.

Figure 4A:
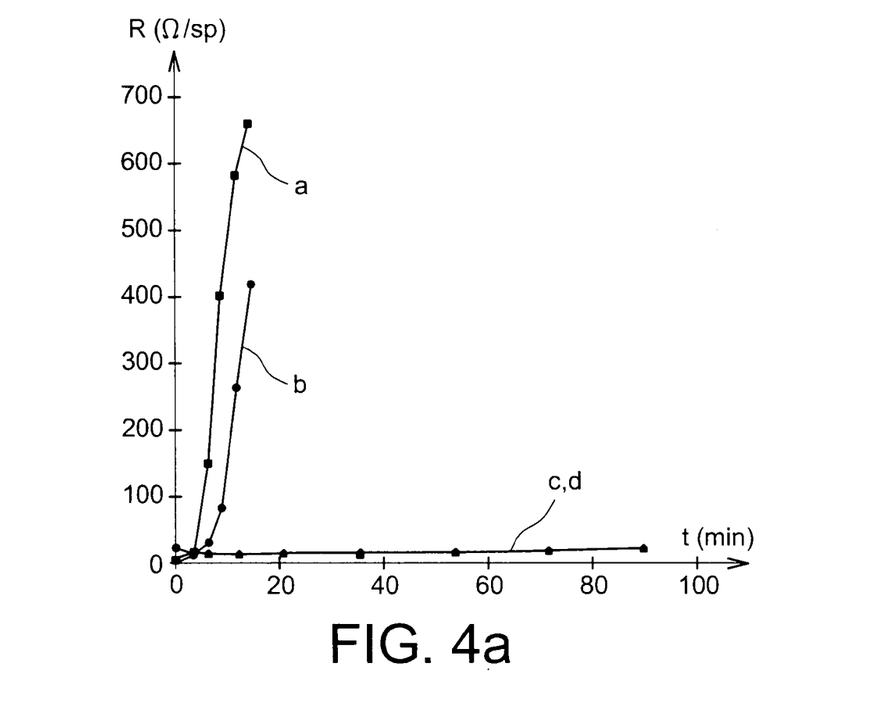
FIGS. 4a and 4b are graphs showing the variation in film resistance R (in Ω/squared denoted Ω/sq) as a function of time t (in min) at 600° C. for various films of NiSi (curves a), NiSi+F (curves b), NiSi+W (curves c) and NiSi+W+F (curves d).
Figure 4B:
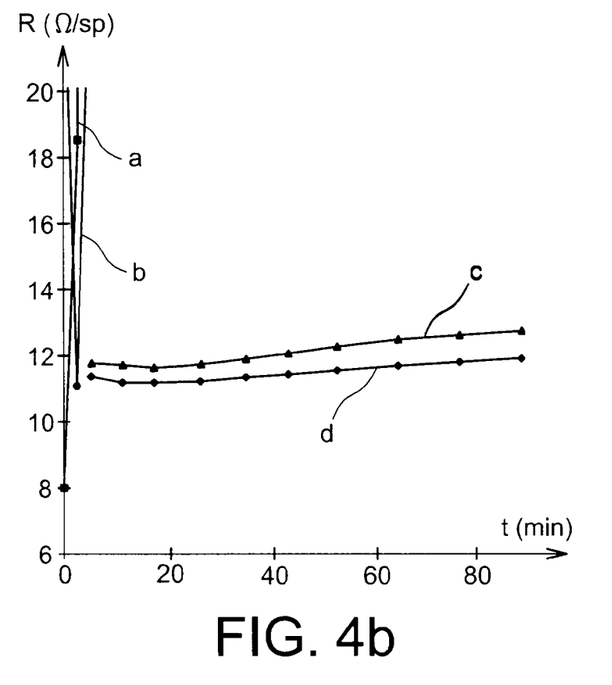
Figure 5A:
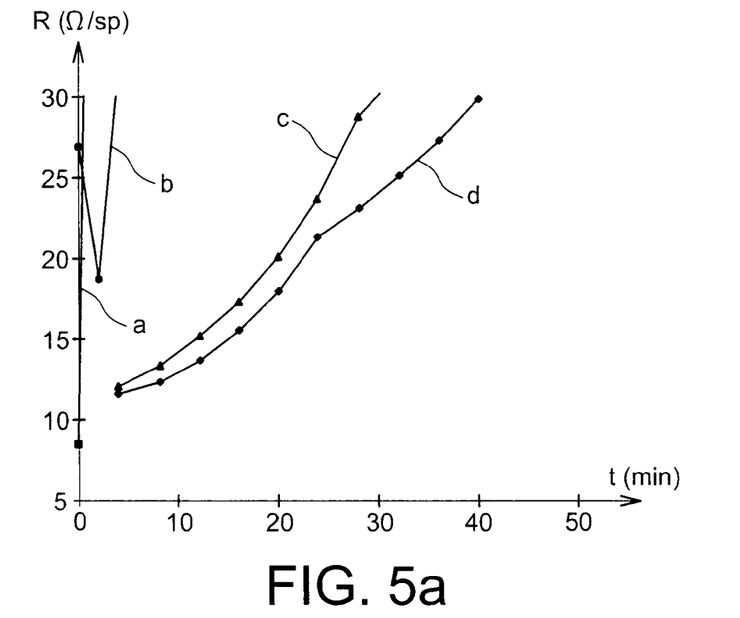
FIGS. 5a and 5b are graphs showing the variation in film resistance R (in Ω/squared denoted Ω/sq) as a function of time t (in min) at 650° C. for various films:
NiSi (curve a), NiSi+F (curve b), NiSi+W (curve c) and NiSi+W+F (curve d) for FIG. 5a;
Ni(Pt)Si (curve a), W+Ni(Pt)Si (curve b) and W+Ni(Pt)Si+F (curve c) for FIG. 5b.
Figure 5B:
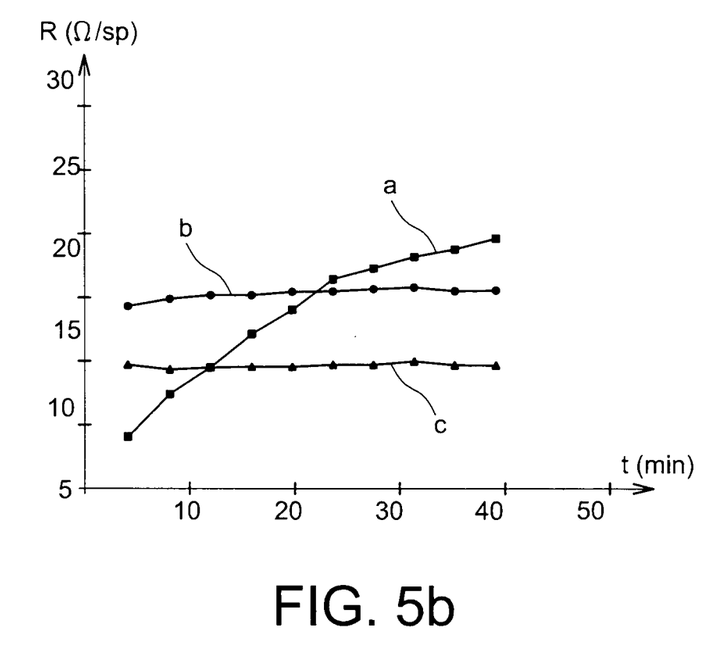

For comparison, the same measurements were taken for samples having undergone only a single W and/or F implantation without Pt in Ni (FIGS. 4a-4b and 5a) and in the presence of Pt in Ni (FIG. 5b).

Thus, FIGS. 4a, 4b are graphs showing the variation in film resistance R (in Ω/squared) as a function of time t (in min) at 600° C. for various films of NiSi (curves a), NiSi+F (curves b), NiSi+W (curves c) and NiSi+W+F (curves d), FIG. 4b showing a y-axis zoom of curve 4a.

FIGS. 5a and 5b are graphs showing the variation in film resistance R (in Ω/squared) as a function of time t (in min) at 650° C. for various films:
NiSi (curve a), NiSi+F (curve b), NiSi+W (curve c) and NiSi+W+F (curve d) for FIG. 5a;
Ni(Pt)Si (curve a), W+Ni(Pt)Si (curve b) and W+Ni(Pt)Si+F (curve c).

From these curves, it can be inferred that the element W provides stability to the films in which it is incorporated, when this film is subjected to temperatures of 600° C., even after one and a half hours of annealing (see curves c for FIGS. 4a and 4b in comparison with curves a and b of these same figures). The combined addition of W and Pt contributes to increase the film resistance (to be compared with curve a in FIG. 5a at t=0 with curve b in FIG. 5b at t=0). F contributes to decrease the film resistance (see curves c and d in FIG. 4b and curves b and c in FIG. 5b).

At 650° C. (FIG. 5a), the film resistance is observed to deteriorate, probably because the NiSi film has aggregated and part of the NiSi is converted to $NiSi_2$.

The addition of platinum therefore becomes necessary above 650° C. (FIG. 5b). The cumulative effect of W and Pt stabilizes NiSi (curve b) but the cumulative presence contributes to yield a film having a high film resistance. The presence of F contributes to lower the film resistance to attractive values, while preserving the stability of the film obtained by the combined action of W and Pt (curve c).

The invention claimed is:

1. A method for fabricating a layer including nickel monosilicide NiSi on a substrate including silicon, the method comprising the following steps in succession:
    a) a step of incorporating, on a portion of a thickness of the substrate, an element selected from W, Ti, Ta, Mo, Cr, and mixtures thereof;
    b) a step of depositing, on the substrate obtained in step a), one of a first layer configuration and a second layer configuration, where the first layer configuration includes a layer of nickel and a layer of an element selected from Pt, Pd, Rh, and mixtures thereof, and where the second layer configuration includes a layer including both nickel and an element selected from Pt, Pd, Rh, and mixtures thereof;
    c) a step of heating the one of the first and second layer configurations to a temperature sufficient to form a layer including nickel silicide that forms optionally as nickel monosilicide NiSi;
    d) a step of incorporating fluorine in the layer including nickel silicide obtained in step c); and
    e) optionally, a step of heating the layer obtained in step d) to a temperature sufficient to convert the layer obtained in step d) to a layer including nickel silicide entirely formed of nickel monosilicide NiSi.

2. The method according to claim 1, wherein step a) is carried out via ion implantation.

3. The method according to claim 1, wherein the thickness of the substrate is between 10 nm and 40 nm.

4. The method according to claim 1, wherein the element incorporated in step a) is present in a content between 0.05 and 1 atomic % of a total number of silicon atoms of the substrate.

5. The method according to claim 1, wherein the element incorporated in step a) is tungsten.

6. The method according to any claim 1, wherein nickel accounts for at least 90 atomic % of a total of atoms of the nickel and the elements selected from Pd, Pt, Rh, and mixtures thereof within the one of the first and second layer configurations obtained in step b).

7. The method according to claim 1, wherein step b) is carried out at a temperature below 100° C.

8. The method according to claim 1, wherein the heating step c) is carried out at a temperature between 200 and 600° C.

9. The method according to claim 1, wherein step d) of incorporating fluorine is carried out via ion implantation.

10. A layer including nickel monosilicide NiSi disposed on a substrate including silicon, the layer comprising:
    an element selected from W, Ti, Ta, Mo, Cr, and mixtures thereof;
    an element selected from Pd, Pt, Rh, and mixtures thereof; and
    fluorine,
    wherein the layer is obtained via the method according to claim 1.

11. The layer according to claim 10, wherein the element selected from W, Ti, Ta, Mo, Cr, and mixtures thereof is present in a content between 0.05 and 1 atomic % of a total number of silicon atoms of the substrate.

12. The layer according to claim 10, wherein the thickness of the substrate is between 10 nm and 40 nm.

13. The layer according to claim 10, wherein nickel of the nickel monosilicide accounts for at least 90 atomic % of a total of atoms of the nickel and of the elements selected from Pd, Pt, Rh, and mixtures thereof within the one of the first and second layer configurations obtained in step b) in the method of claim 1.

14. A method for fabricating an electronic device, the method comprising the following steps in succession:
    a step of preparing constituent elements of the electronic device, at least one of the constituent elements being in silicon; and
    a step of depositing, on each silicon constituent element, a layer including nickel monosilicide NiSi, the layer being obtained via the method according to claim 1.

15. The method according to claim 14, wherein the electronic device is an MOS transistor.

16. An electronic device comprising:
    at least one silicon constituent element; and
    a layer covering the at least one silicon constituent element, the layer including nickel monosilicide NiSi, and the layer being obtained via the method according to claim 1, the layer including
        the element in step a) selected from W, Ti, Ta, Mo, Cr, and mixtures thereof,
        the element in step b) selected from Pd, Pt, Rh, and mixtures thereof; and
        fluorine.

17. The electronic device according to claim 16, wherein the electronic device is an MOS transistor including a source, a drain, and a grid, and
    wherein the at least one silicon constituent element covered by the layer includes the source, the drain, and the grid.

18. A method for fabricating a three-dimensional integrated circuit of MOS type including transistors having different conductivities, the transistors being formed respectively in first and second superimposed semiconductor layers, the method comprising the following steps in succession:
    a step of fabricating a first level including at least one n-MOS type transistor including a source, a drain, and a grid, formed in a silicon semiconductor layer;
    a step of depositing a layer including nickel monosilicide on silicon portions of the at least one n-MOS type transistor, the silicon portions being the source, the drain, and the grid, the layer including nickel monosilicide NiSi being obtained via the method to claim 1;
    a step of transferring to the first level a germanium semiconductor layer, thereby constituting a second level on the first level; and
    a step of fabricating in the second level at least one p-MOS type transistor in the germanium semiconductor layer.

19. A three-dimensional integrated circuit of MOS type comprising:
    a first level including at least one n-MOS type transistor including a source, a drain, and a grid, formed in a silicon semiconductor layer;
    layers including nickel monosilicide NiSi disposed on silicon portions of the at least one n-MOS type transistor, the silicon portions being the source, the drain, and the grid, the layers being obtained via the method according to claim 1, and the layers including
        the element in step a) selected from W, Ti, Ta, Mo, Cr, and mixtures thereof, the element in step b) selected from Pd, Pt, Rh, and mixtures thereof, and
fluorine; and
a second level on the first level including a germanium semiconductor layer including at least one p-MOS type transistor.

20. The method according to claim 1, wherein the fluorine used in step d) decreases film resistance of the layer formed in step c).

* * * * *